(12) United States Patent
Jen et al.

(10) Patent No.: US 6,436,740 B1
(45) Date of Patent: Aug. 20, 2002

(54) TRI-LAYER PROCESS FOR FORMING TFT MATRIX OF LCD WITH REDUCED MASKING STEPS

(75) Inventors: Tean-Sen Jen; Jia-Shyong Cheng, both of Taoyuan (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/615,919

(22) Filed: Jul. 13, 2000

(30) Foreign Application Priority Data

Jul. 30, 1999 (TW) .......................................... 88113076

(51) Int. Cl.⁷ .............................................. H01L 21/00
(52) U.S. Cl. ...................................... 438/149; 438/159
(58) Field of Search ................................ 438/149–166, 438/30, 609; 257/57, 77

(56) References Cited

U.S. PATENT DOCUMENTS

| | | | |
|---|---|---|---|
| 5,346,833 A | | 9/1994 | Wu ................................. 437/4 |
| 5,366,912 A | * | 11/1994 | Kobayashi .................... 437/40 |
| 5,478,766 A | | 12/1995 | Park et al. .................... 437/40 |
| 5,610,082 A | * | 3/1997 | Oh ................................ 437/21 |
| 5,621,556 A | * | 4/1997 | Fulks et al. .................... 349/42 |
| 5,648,674 A | * | 7/1997 | Weisfield et al. ........... 257/428 |
| 5,717,223 A | * | 2/1998 | Hack et al. .................... 257/57 |
| 5,811,325 A | * | 9/1998 | Lin et al. ..................... 438/159 |
| 5,962,896 A | * | 10/1999 | Yabuta et al. ................ 257/347 |
| 6,008,065 A | * | 12/1999 | Lee et al. ...................... 438/30 |
| 6,184,947 B1 | * | 2/2001 | Ozaki et al. ................... 349/42 |
| 6,184,960 B1 | * | 2/2001 | Sawayama et al. ......... 349/139 |
| 6,242,758 B1 | * | 6/2001 | Yamazaki et al. ............. 257/59 |
| 6,243,146 B1 | * | 6/2001 | Rho et al. ...................... 349/42 |
| 6,274,400 B1 | * | 8/2001 | Jen ............................... 438/30 |

* cited by examiner

Primary Examiner—David Nelms
Assistant Examiner—David Vu
(74) Attorney, Agent, or Firm—Michael Best & Friedrich LLC; J. Warren Whitesel

(57) ABSTRACT

A simplified tri-layer process for forming a thin film transistor matrix for a liquid crystal display is disclosed. By using a backside exposure technique, the masking step for patterning an etch stopper layer can be omitted. After forming an active region including a gate electrode and a scan line on the front side of a substrate, and sequentially applying an etch stopper layer and a photoresist layer over the resulting structure, the backside exposure is performed by exposing from the back side of the substrate. A portion of photoresist is shielded by the active region from exposure so that an etch stopper structure having a shape similar to the shape of the active region is formed without any photomasking and lithographic procedure. Therefore, the above self-aligned effect allows one masking step to be reduced so as to simplify the process.

32 Claims, 15 Drawing Sheets

TRI-LAYER PROCESS FOR FORMING TFT MATRIX OF LCD WITH REDUCED MASKING STEPS

FIELD OF THE INVENTION

The present invention relates to a process for forming a thin film transistor (TFT) matrix for a liquid crystal display (LCD), and more particularly to a simplified tri-layer process for forming the TFT matrix with reduced masking steps.

BACKGROUND OF THE INVENTION

For conventional manufacturing processes of a TFTLCD, a tri-layer process and a back channel etch (BCE) process are main streams for forming the TFT matrix. Compared to a BCE structure, a tri-layer structure additionally includes an top nitride over the semiconductor layer as an etch stopper so that the etching step for defining a source/drain and channel region can be well controlled. Accordingly, the thickness of the active layer can be made to be thinner in the tri-layer structure than in the BCE structure, which is advantageous for the stability of resulting devices and performance in mass production. However, the provision of the additional etch stopper layer needs an additional masking step, thereby making the tri-layer process relatively complicated.

Conventionally, six to nine masking steps are required for either a BCE process or a tri-layer process. As known, the count of photo-masking and lithography steps directly affects not only the production cost but also the manufacturing time. Moreover, for each photo-masking and lithography step, the risks of mis-alignment and contamination may be involved so as to affect the production yield. Therefore, many efforts have been made to improve the conventional processes to reduce masking steps.

For example, for a BCE structure, U.S. Pat. Nos. 5,346,833 and 5,478,766 issued to Wu and Park et al., respectively, disclose 3 and/or 4-mask processes for making a TFTLCD, which are incorporated herein for reference. By the way, it is to be noted that the 3-mask process for each of Wu and Park et al. does not include the step of forming and patterning of a passivation layer. If a passivation layer is required to assure of satisfactory reliability, the count of photo-masking and lithography steps should be four.

As for the tri-layer structure, a conventional 6-mask process is illustrated as follows with reference to FIGS. 1A~1G which are cross-sectional views of intermediate structures at different stages. The conventional process includes steps of:

i) applying a first conductive layer onto a glass substrate 10, and using a first photo-masking and lithography procedure to pattern and etch the first conductive layer to form an active region 11 consisting of a scan line and a gate electrode of a TFT unit, as shown in FIG. 1A;

ii) sequentially forming tri-layers including an insulation layer 121, a semiconductor layer 122 and an etch stopper layer 123, and a photoresist 124 on the resulting structure of FIG. 1A, as shown in FIG. 1B.

iii) using a second photo-masking and lithography procedure to pattern and etch the etch stopper layer 123 to form an etch stopper 13 which have a shape similar to the shape of the gate electrode, as shown in FIG. 1C;

iv) using a third photo-masking and lithography procedure to pattern and etch the semiconductor layer 122 to form a channel structure 14, as shown in FIG. 1D;

v) sequentially applying a doped semiconductor layer and a second conductive layer on the resulting structure of FIG. 1D, and using a fourth photo-masking and lithography procedure to pattern and etch them to form source/drain regions 15 and data and connection lines 16, as shown in FIG. 1E;

vi) applying a passivation layer 17 on the resulting structure of FIG. 1E, and using a fifth photo-masking and lithography procedure to pattern and etch the passivation layer 17 to create tape automated bonding (TAB) openings (not shown), and create a contact window 18, as shown in FIG. 1F; and vii) applying a transparent electrode layer on the resulting structure of FIG. 1F, and using a sixth photo-masking and lithography procedure to pattern and etch the transparent electrode layer to form a pixel electrode 19, as shown in FIG. 1G.

Six masking steps, however, are still too complicated.

SUMMARY OF THE INVENTION

Therefore, an object of the present invention is to provide a reduced mask process for forming a thin film transistor (TFT) matrix for a liquid crystal display (LCD), in which the count of photo-masking and lithography steps can be reduced to five, or even four.

According to a first aspect of the present invention, a process for forming a TFT matrix for. an LCD includes steps of: providing a substrate made of an insulating material; forming a first conductive layer on a first side of the substrate, and using a first masking and patterning procedure to remove a portion of the first conductive layer to define a scan line and a gate electrode of a TFT unit; successively forming an insulation layer, a semiconductor layer, an etch stopper layer, and a photoresist layer on the substrate with the scan line and the gate electrode; providing an exposing source from a second side of the substrate opposite to the first side by using the scan line and the gate electrode as shields to obtain an exposed area and an unexposed area; removing the photoresist, and the etch stopper layer of the exposed area so that the remaining portion of the etch stopper layer in the unexposed area has a specific shape substantially identical to the shape of the scan line together with the gate electrode; forming a doped semiconductor layer on the substrate with the etch stopper layer of the specific shape, and using a second masking and patterning procedure to remove a portion of the doped semiconductor layer and a portion of the semiconductor layer to define a channel region; successively forming a transparent conductive layer and a second conductive layer on the substrate, and using a third masking and patterning procedure to remove a portion of the transparent conductive layer and a portion of the second conductive layer to define a pixel electrode region and data and connection lines, respectively; removing another portion of the doped semiconductor layer with a remaining portion of the second conductive layer as shields to define source/drain regions; forming a passivation layer on the substrate, and using a fourth masking and patterning procedure to remove a portion of the passivation layer; and removing another portion of the second conductive layer with the patterned passivation layer as shields to expose the pixel electrode region.

When the exposing source is a light radiation, the insulating material is a light-transmitting material such as glass.

Preferably, the first conductive layer is formed of chromium, tungsten molybdenum, tantalum, aluminum or copper.

Preferably, the insulation layer is formed of silicon nitride, silicon oxide, silicon oxynitride, tantalum oxide or aluminum oxide.

Preferably, the etch stopper layer and the semiconductor layer have a high etching selectivity for respective etching gases. For example, the semiconductor layer is formed of intrinsic amorphous silicon, micro-crystalline silicon or polysilicon. An etching gas for the semiconductor layer is selected from a group consisting of carbon tetrafluoride, boron trichloride, chlorine, sulfur hexafluoride, and a mixture thereof. The etch stopper layer is formed of silicon nitride, silicon oxide or silicon oxynitride. The etching gas for the etch stopper layer is selected from a group consisting of carbon tetrafluoride/hydrogen, trifluoromethane, sulfur hexafluoride/hydrogen, and a mixture thereof.

Preferably, the doped semiconductor layer is formed of highly amorphous silicon, highly micro-crystalline silicon or highly polysilicon.

Preferably, the second conductive layer is a Cr/Al or a Mo/Al/Mo composite layer.

Preferably, the transparent conductive layer is formed of indium tin oxide, indium zinc oxide or indium lead oxide.

Preferably, the passivation layer is formed of silicon nitride or silicon oxynitride.

Preferably, after removing the another portion of the second conductive layer after the fourth masking and patterning procedure, a remaining portion of the second conductive layer surrounds the pixel electrode region as black matrix.

According to a second aspect of the present invention, a process for forming a TFT matrix for an LCD includes steps of: providing a substrate made of an insulating material; forming a first conductive layer on a first side of the substrate, and using a first masking and patterning procedure to remove a portion of the first conductive layer to define a scan line and a gate electrode of a TFT unit; successively forming an insulation layer, a semiconductor layer, an etch stopper layer, and a photoresist layer on the substrate with the scan line and the gate electrode; providing an exposing source from a second side of the substrate opposite to the first side by using the scan line and the gate electrode as shields to obtain an exposed area and an unexposed area; removing the photoresist and the etch stopper layer of the exposed area so that the remaining portion of the etch stopper layer in the unexposed area has a specific shape substantially identical to the shape of the scan line together with the gate electrode; using a second masking and patterning procedure to remove a portion of the semiconductor layer to define a channel region; successively forming a doped semiconductor layer and a second conductive layer on the substrate, and using a third masking and patterning procedure to remove a portion of the second conductive layer to define data and connection lines; removing a portion of the doped semiconductor layer with a remaining portion of the second conductive layer as shields to define source/drain regions; forming a passivation layer on the substrate, and using a fourth masking and patterning procedure to remove a portion of the passivation layer to define a contact window; and forming a transparent conductive layer on the substrate, and using a fifth masking and patterning procedure to remove a portion of the transparent conductive layer to define a pixel electrode region which is connected to the data and connection lines through the contact window.

Preferably, the insulating material is glass; the first conductive layer is selected from a chromium, a tungsten molybdenum, a tantalum, an aluminum and a copper layers; the second conductive layer is selected from a Cr/Al and a Mo/Al/Mo composite layers; the insulation layer is formed of a material selected from silicon nitride, silicon oxide, silicon oxynitride, tantalum oxide and aluminum oxide; the semiconductor layer is formed of a material selected from amorphous silicon, micro-crystalline silicon and polysilicon; the etch stopper layer is formed of a material selected from silicon nitride, silicon oxide and silicon oxynitride; the doped semiconductor layer is formed of a material selected from highly doped amorphous silicon, micro-crystalline silicon and polysilicon; the passivation layer is formed of a material selected from silicon nitride and silicon oxynitride; and the transparent conductive layer is formed of a material selected from indium tin oxide, indium zinc oxide and indium lead oxide.

According to a third aspect of the present invention, a process for forming a TFT matrix for an LCD includes steps of: providing a substrate made of an insulating material; forming a first conductive layer on a first side of the substrate, and using a first masking and patterning procedure to remove a portion of the first conductive layer to define a scan line and a gate electrode of a TFT unit; successively forming an insulation layer, a semiconductor layer, an etch stopper layer, and a photoresist layer on the substrate with the scan line and the gate electrode; providing an exposing source from a second side of the substrate opposite to the first side by using the scan line and the gate electrode as shields to obtain an exposed area and an unexposed area; removing the photoresist and the etch stopper layer of the exposed area so that the remaining portion of the etch stopper layer in the unexposed area has a specific shape substantially identical to the shape of the scan line together with the gate electrode; forming a doped semiconductor layer on the substrate with the etch stopper layer of the specific shape, and using a second masking and patterning procedure to remove a portion of the doped semiconductor layer and a portion of the semiconductor layer to define a channel region; forming a second conductive layer on the substrate, and using a third masking and patterning procedure to remove a portion of the second conductive layer to define data and connection lines; removing a portion of the doped semiconductor layer with a remaining portion of the second conductive layer as shields to define source/drain regions; forming a passivation layer on the substrate, and using a fourth masking and patterning procedure to remove a portion of the passivation layer to define a contact window; and forming a transparent conductive layer on the substrate, and using a fifth masking and patterning procedure to remove a portion of the transparent conductive layer to define a pixel electrode region which is connected to the data and connection lines through the contact window.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following description of the preferred embodiment of this invention is presented herein for purpose of illustration and description only; it is not intended to be exhaustive or to be limited to the precise form disclosed.

Figure 1A:
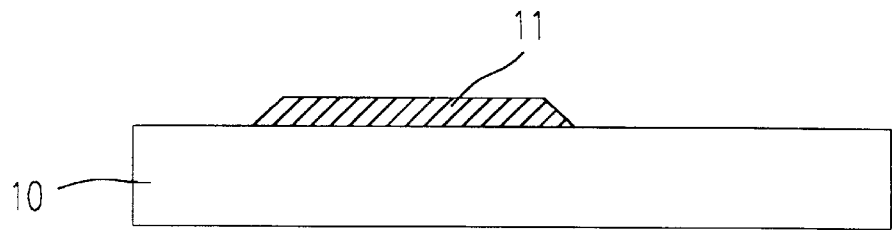
FIGS. 1A~1G are cross-sectional views of intermediate structures of a conventional TFTLCD, which schematically show the formation of the TFT matrix.
Figure 1B:
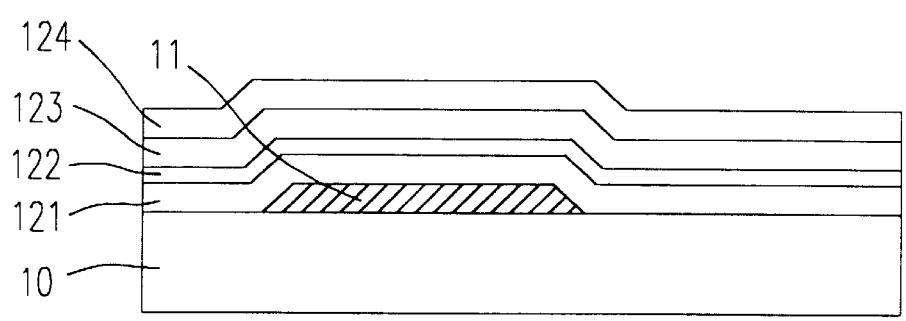
Figure 1C:
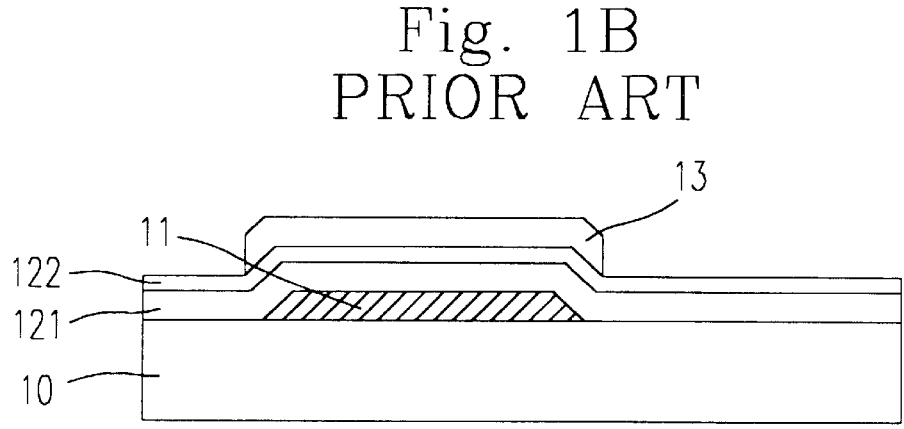
Figure 1D:
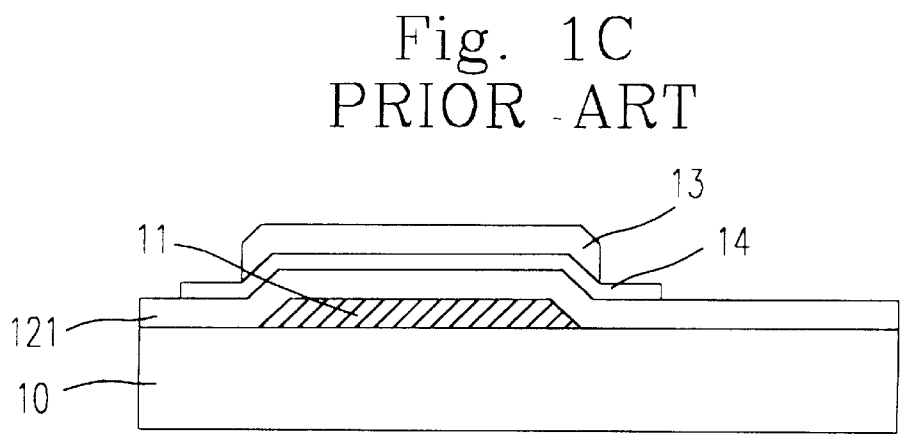
Figure 1E:
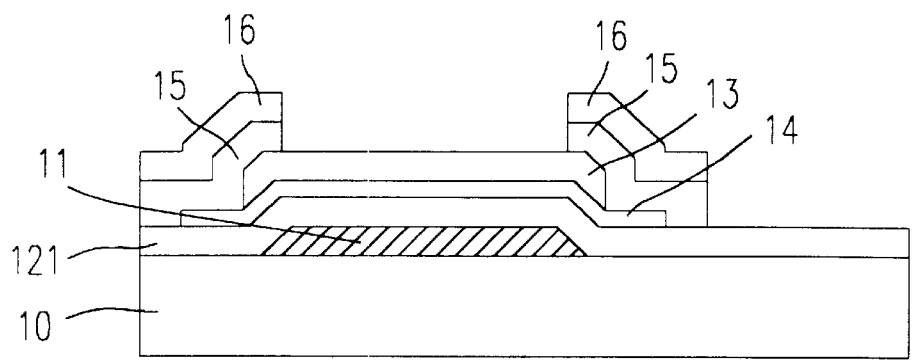
Figure 1F:
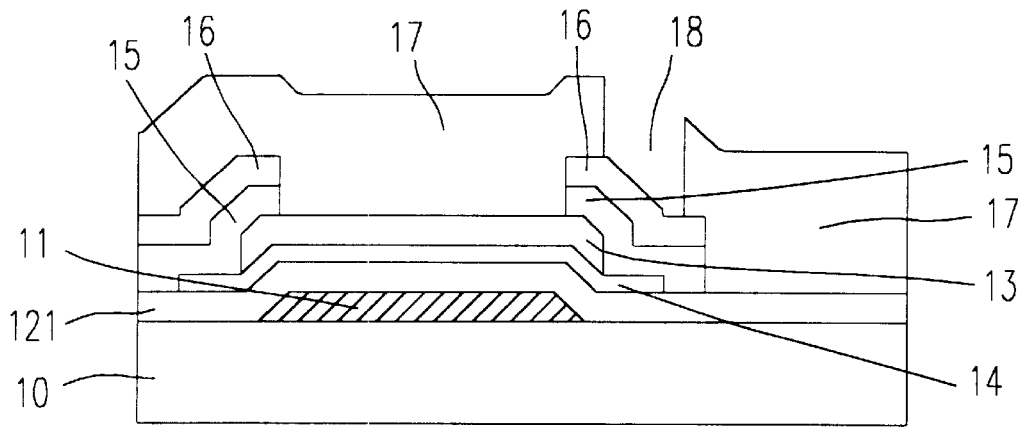
Figure 1G:
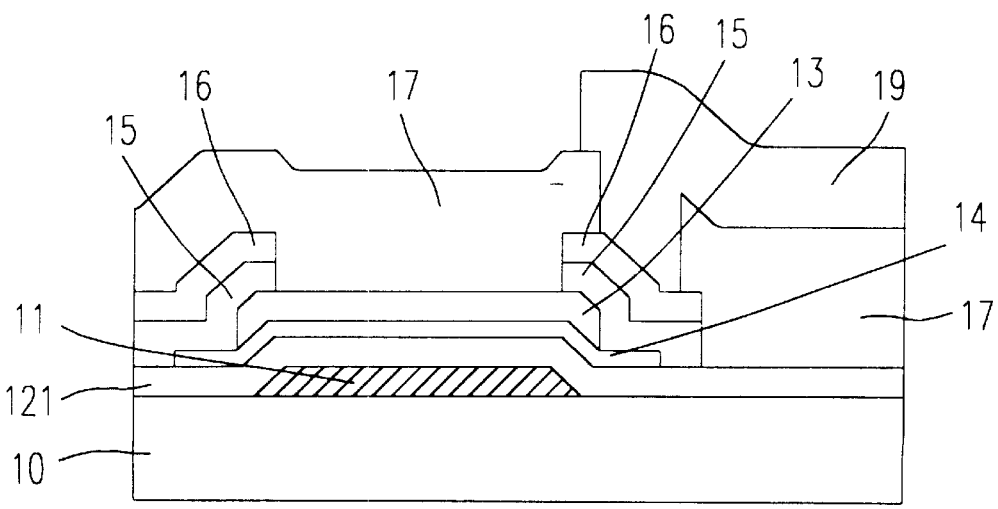
Figure 2A:
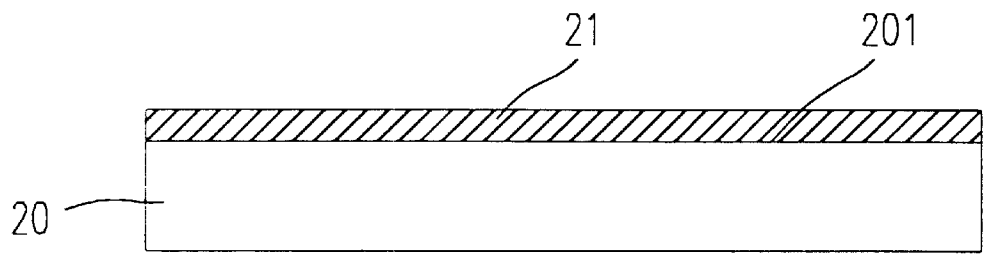
FIGS. 2A~2K are cross-sectional views of intermediate structures of a TFTLCD according to the present invention, which schematically show a first preferred embodiment of a process for forming the TFT matrix.
Figure 2B:
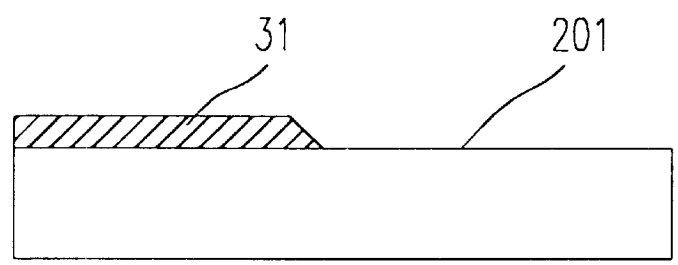
Figure 2C:
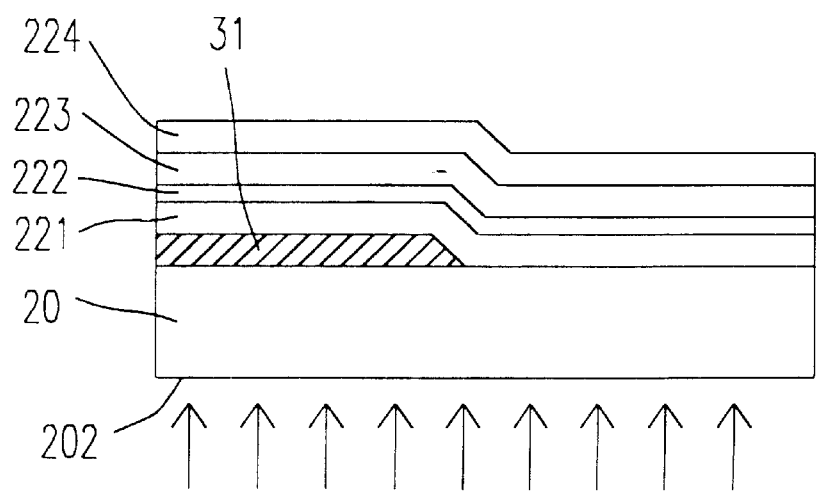
Figure 2D:
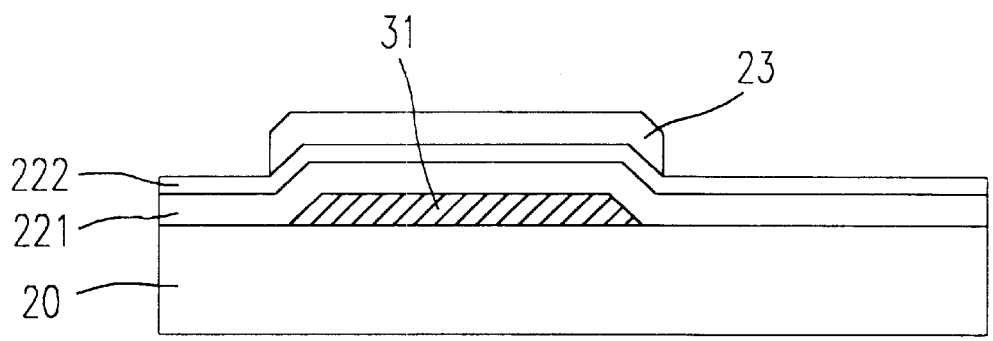
Figure 2E:
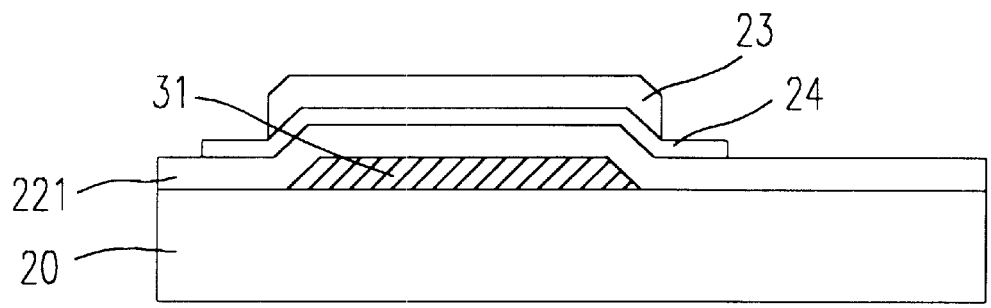
Figure 2F:
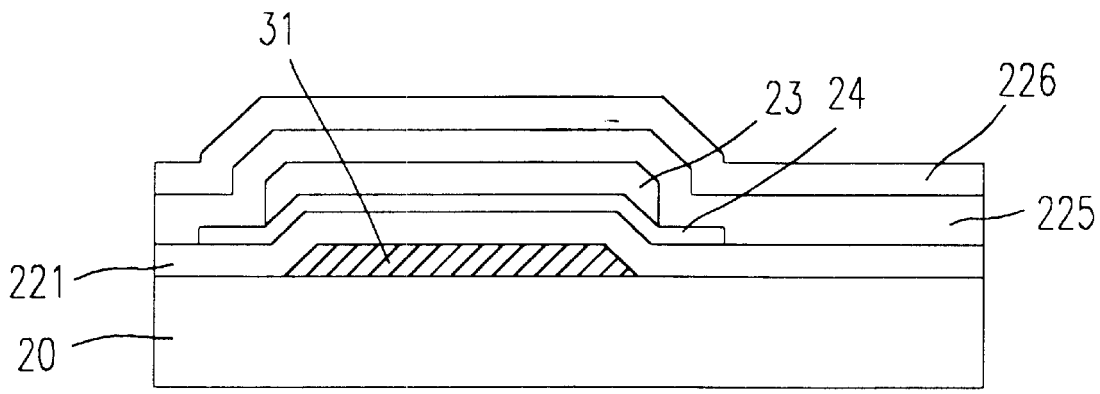
Figure 2G:
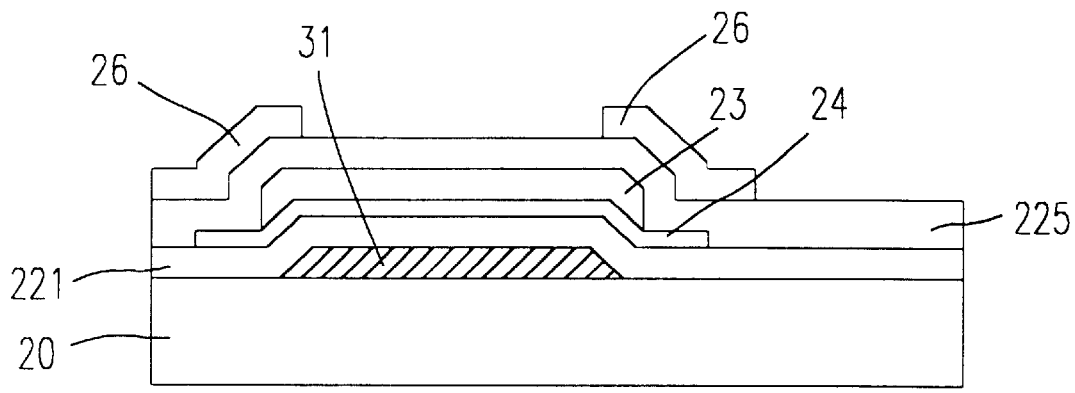
Figure 2H:
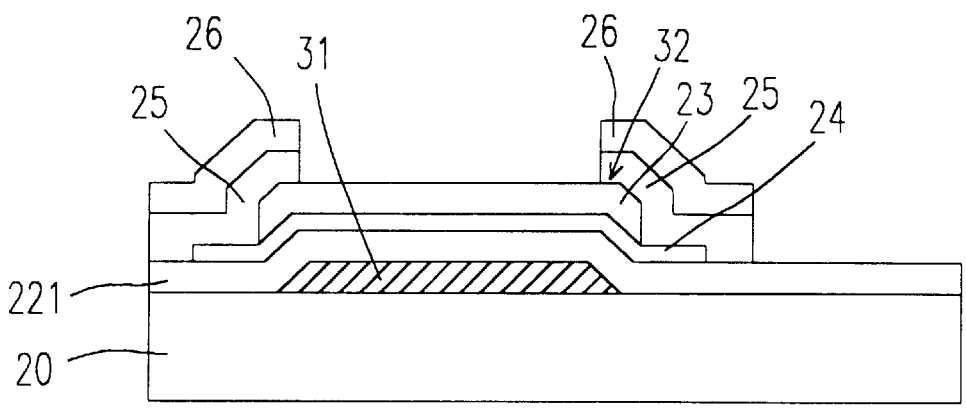
Figure 2I:
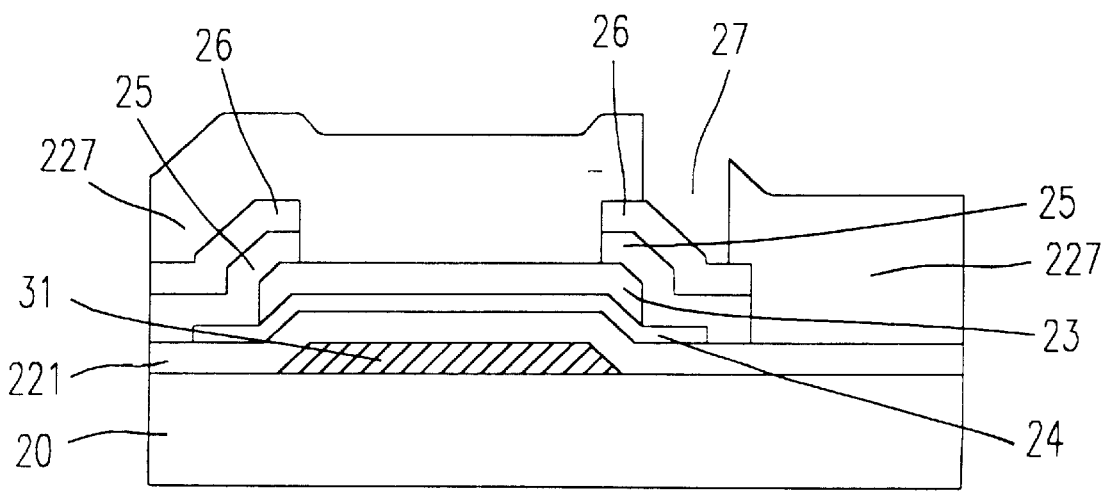
Figure 2J:
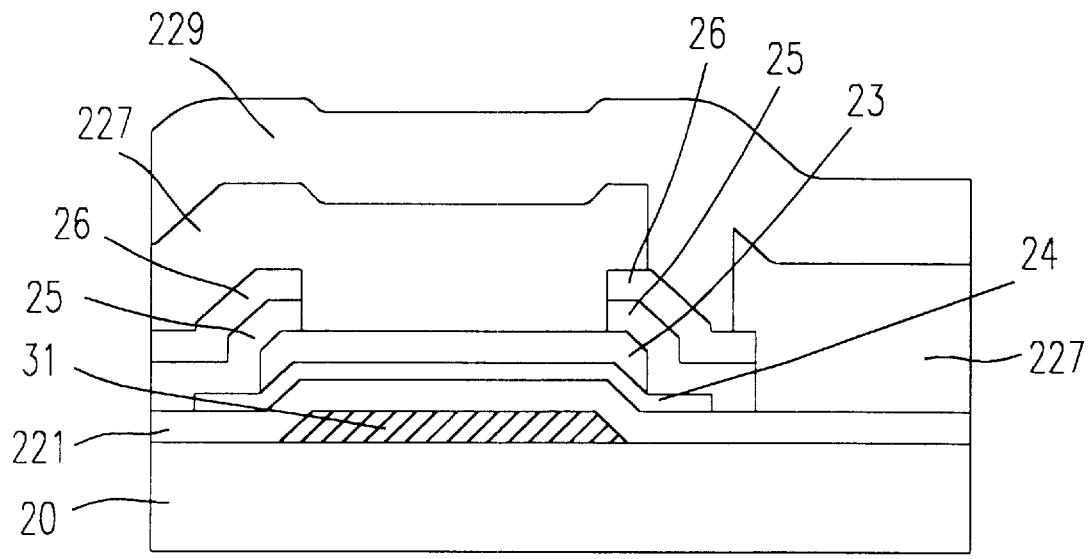
Figure 2K:
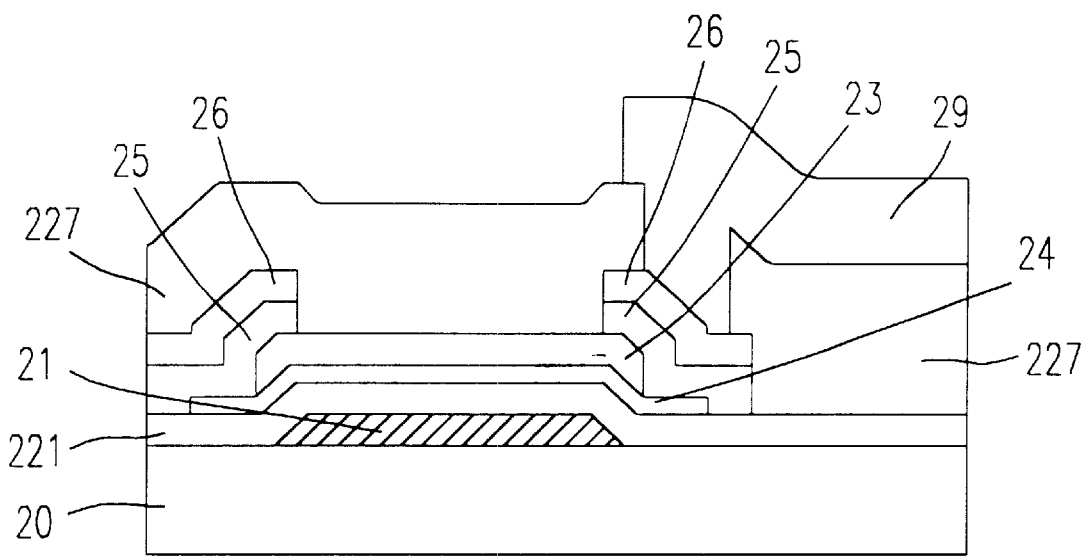
Figure 3A:
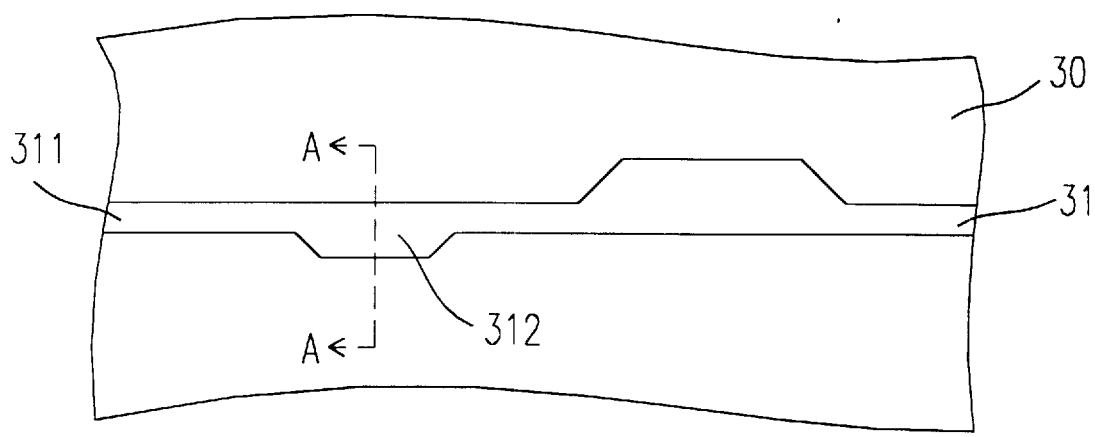
FIGS. 3A~3C are partial top plane views corresponding to the structures of FIGS. 2B, 4B and 5B, respectively.

A first preferred embodiment of a process for forming a TFT matrix of a TFTLCD according to the present invention directs to a five-mask process, and it is illustrated with reference to FIGS. 2A–2H. It is to be noted that the division of steps and the provision of serial numbers as below are for corresponding to the drawings, and for easy illustration and understanding, instead of critically indicating.the separation or the integration of steps. The preferred embodiment of the process includes steps of:

i) applying a Cr layer 21 onto a front side 201 of a glass substrate 20 as a first conductive layer, as shown in FIG. 2A;

ii) using a first photo-masking and lithography procedure to pattern and etch the Cr layer 21 to form an active region 31 consisting of a scan line 311 and a gate electrode 312 of a TFT unit, as shown in FIGS. 2B and 3 wherein FIG. 2B is a cross-sectional view taken along the A—A line of FIG. 3A;

iii) consecutively and sequentially forming a silicon nitride layer 221 as an insulation layer, an intrinsic amorphous silicon (i-a-Si) layer 222 as a semiconductor layer, a top silicon nitride layer 223 as an etch stopper layer, and a photoresist 224 on the resulting structure of FIG. 2B, as shown in FIG. 2C, and exposing the resulting structure from the back side 202 of the substrate 20, as indicated by arrows, wherein a portion of the photoresist 224 above the region 31 is shielded by the region 31 from exposure so as to exhibit a self-aligned effect;

iv) etching off the exposed photoresist 224, a portion of the top silicon nitride layer 223 thereunder, and the remaining photoresist so that the remaining etch stopper structure 23 has a shape substantially identical to the region 31, as shown in FIG. 2D and with reference to FIG. 3A;

v) using a second photo-masking and lithography procedure to pattern and etch the i-a-Si layer 222 to define a channel structure 24, as shown in FIG. 2E;

vi) sequentially applying an $n^+$ amorphous silicon layer 225 and a Cr/Al composite layer 226 on the resulting structure of FIG. 2E as a highly doped semiconductor layer and a second conductive layer, respectively, as shown in FIG. 2F;

vii) using a third photo-masking and lithography procedure to pattern and etch the Cr/Al composite layer 226 to define data and connection lines 26, as shown in FIG. 2G;

viii) using the remaining Cr/Al layer as a shield to etch off a portion of the $n^+$ amorphous silicon layer 225 to define source/drain regions 25, as shown in FIG. 2H where the TFT unit 32 is formed;

ix) applying a silicon nitride layer 227 on the resulting structure of FIG. 2H as a passivation layer, and using a fourth photo-masking and lithography procedure to pattern and etch the passivation layer 227 to create a contact window 27 to expose a portion of the data and connection lines 26, as shown in FIG. 2I, and also to define a tape automated bonding (TAB) openings (not shown);

x) applying an ITO layer 229 on the resulting structure of FIG. 2I as a transparent conductive layer, as shown in FIG. 2J; and xi) using a fifth photo-masking and lithography procedure to pattern and etch the ITO layer 229 to form a pixel electrode 29, as shown in FIG. 2K.

In the step i) of the above embodiment, the first conductive layer 21 can be applied by any suitable conventional technique which is not to be redundantly described here. In this embodiment, the substrate 20 is formed of glass which is transparent for allowing light type of exposing source to transmit therethrough. The substrate 20, however, can also be made of another transparent, translucent or opaque material, depending on the type of the exposing source. On the other hand, the first conductive layer 21 can also be formed of tungsten molybdenum, tantalum, aluminum or copper.

In the step ii) of the above embodiment, the photo-masking and lithography procedure can be performed by any suitable conventional technique which is not to be redundantly described here.

In the step iii) of the above embodiment, the insulation layer 221, semiconductor layer 222, etch stopper layer 223 and photoresist 224 can be applied by any suitable conventional techniques which are not to be redundantly described here. The insulation layer 221 can also be formed of silicon oxide, silicon oxynitride, tantalum oxide or aluminum oxide. The semiconductor layer 222 can also be formed microcrystalline silicon or polysilicon. The etch stopper layer 223 can also be formed of silicon oxide or silicon oxynitride. It is to be noted that the there preferably exists a high etching selectivity between the silicon nitride etching stopper layer 223 and the semiconductor layer 222 so that the etching procedure of the etch stopper layer will not damage the semiconductor layer. The etching gas for the semiconductor layer is selected from a group consisting of carbon tetrafluoride ($CF_4$), boron trichloride ($BCl_3$), chlorine ($Cl_2$), sulfur hexafluoride ($SF_6$), and a mixture thereof. The etching gas for the etch stopper layer is selected from a group consisting of carbon tetrafluoride/hydrogen ($CF_4/H_2$), trifluoromethane ($CHF_3$), sulfur hexafluoride/hydrogen ($SF_6/H_2$), and a mixture thereof.

In the step iv) of the above embodiment, the etching procedure can be performed by any suitable conventional technique which is not to be redundantly described here.

In the step v) of the above embodiment, the photo-masking and lithography procedure can be performed by any suitable conventional technique which is not to be redundantly described here.

In the step vi) of the above embodiment, the highly doped semiconductor layer 225 and the second conductive layer 226 can be applied by any suitable conventional techniques which are not to be redundantly described here. In this embodiment, the highly doped semiconductor layer 225 can also be formed of $n^+$ micro-crystalline silicon or $n^+$ polysilicon. The second conductive layer 226 can also be a Mo/Al/Mo layer.

In the step vii) of the above embodiment, the photo-masking and lithography procedure and the etching procedure can be performed by any suitable conventional techniques which are not to be redundantly described here. The term "data and connection lines" used herein includes a data line and a connection line between the TFT unit and the data line.

In the step viii) of the above embodiment, the etching procedure can be performed by any suitable conventional technique which is not to be redundantly described here.

In the step ix) of the above embodiment, the passivation layer 227 can be applied by any suitable conventional technique which is not to be redundantly described here. The passivation layer 227 can also be formed of silicon oxynitride. On the other hand, the photo-masking and lithography procedure can be performed by any suitable conventional technique which is not to be redundantly described here.

In the step x) of the above embodiment, the transparent conductive layer 229 can be applied by any suitable conventional technique. The transparent conductive layer can also be formed of indium zinc oxide or indium lead oxide.

In the step xi) of the above embodiment, the photo-masking and lithography procedure can be performed by any suitable conventional technique which is not to be redundantly described here.

According to the process mentioned above, the formation of the etch stopper structure 23 is performed by a backside exposure technique as disclosed in the step iii), which uses the existent active region as shields so that one masking step is omitted, and only five masking and patterning procedures are required.

Figure 3B:
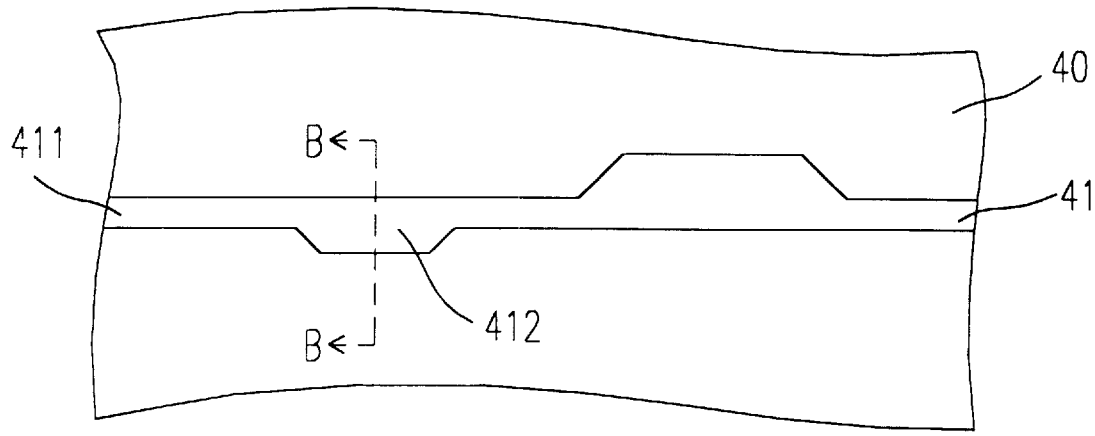
Figure 4A:
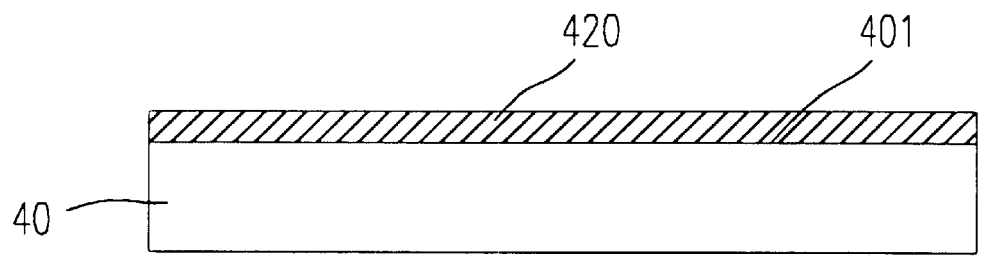
FIGS. 4A~4L are cross-sectional views of intermediate structures of a TFTLCD according to the present invention, which schematically show a second preferred embodiment of a process for forming the TFT matrix.
Figure 4B:
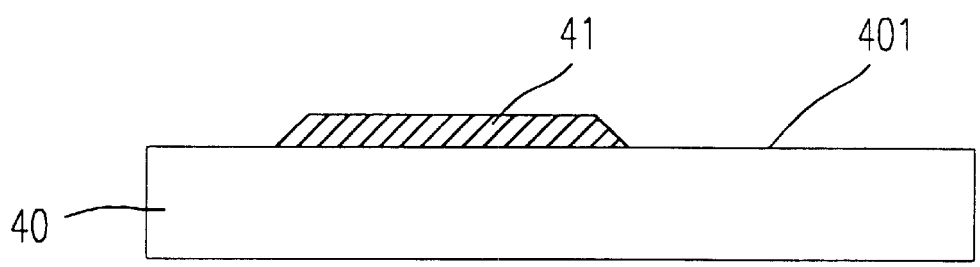
Figure 4C:
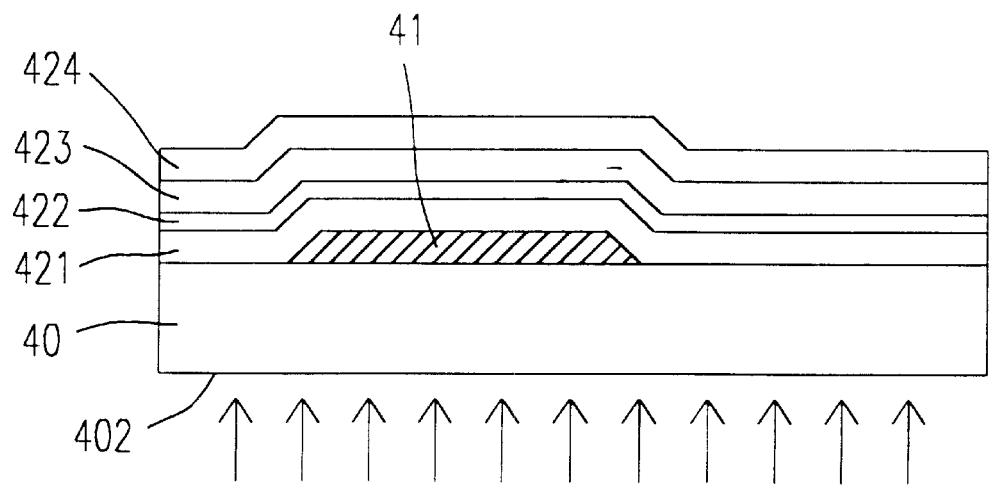
Figure 4D:
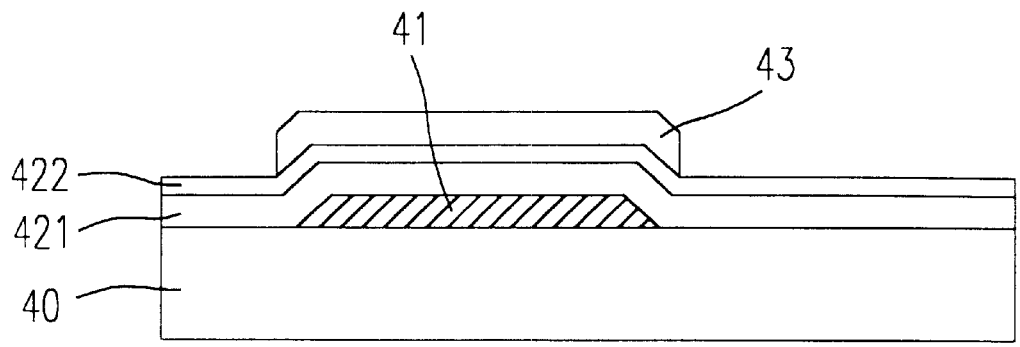
Figure 4E:
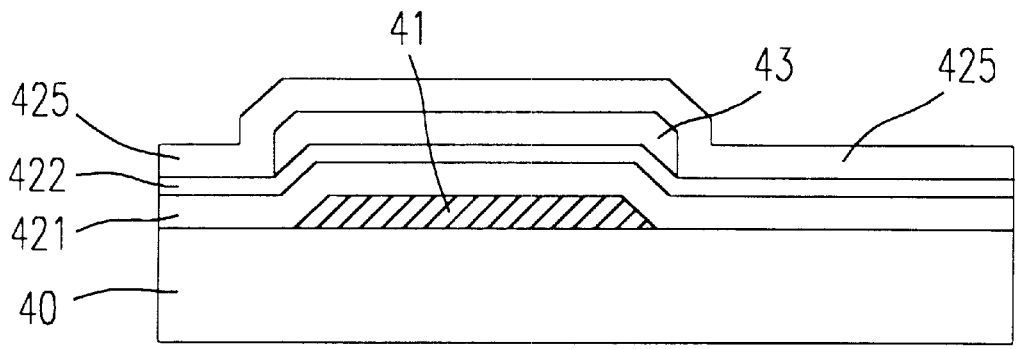
Figure 4F:
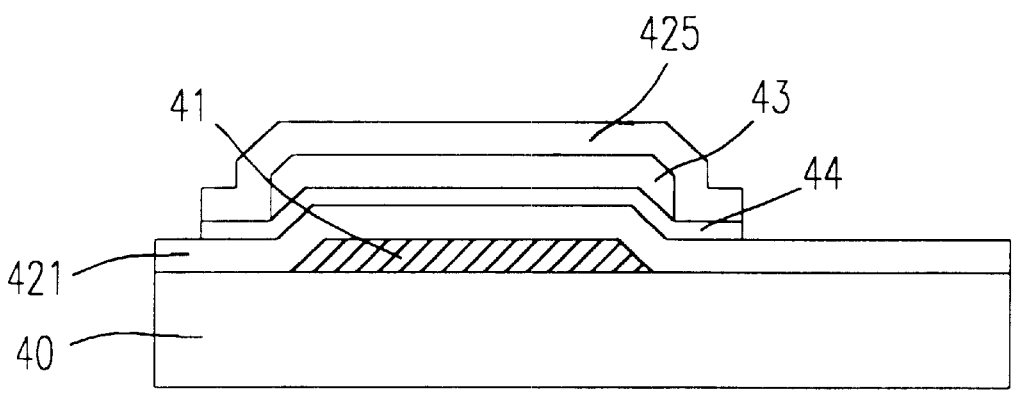
Figure 4G:
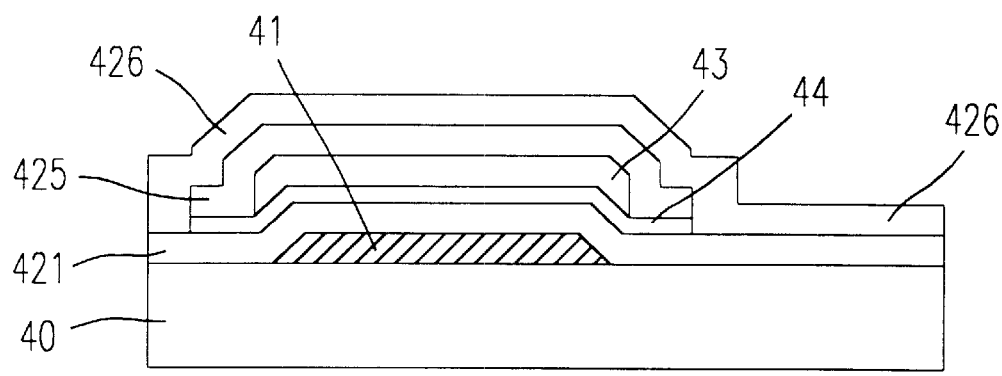
Figure 4H:
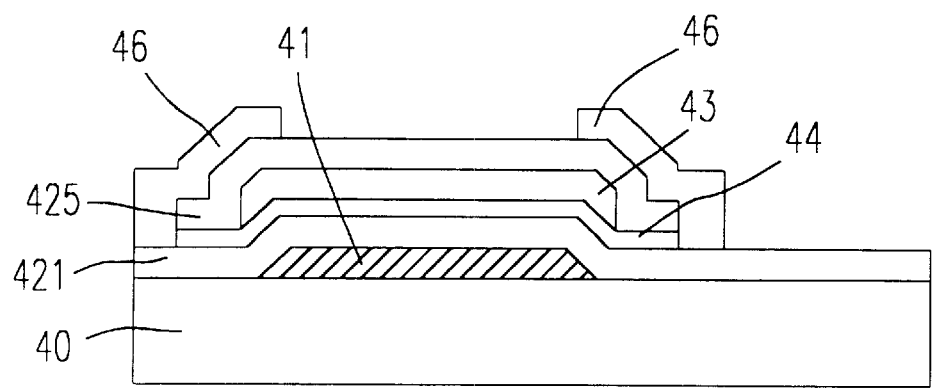
Figure 4I:
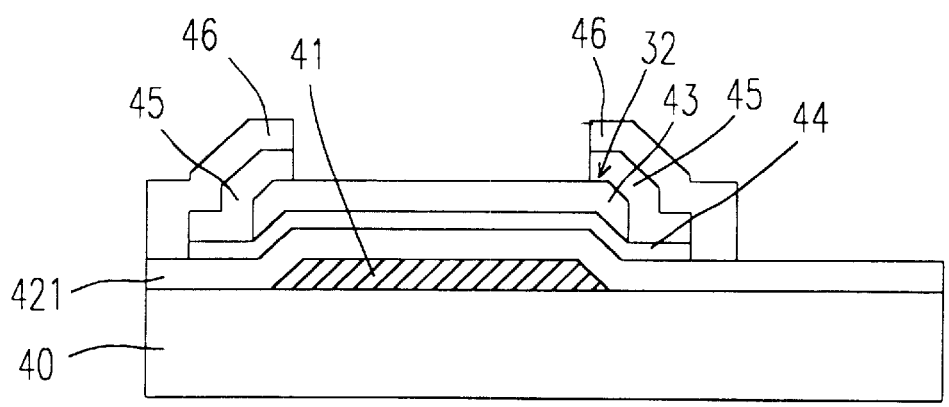
Figure 4J:
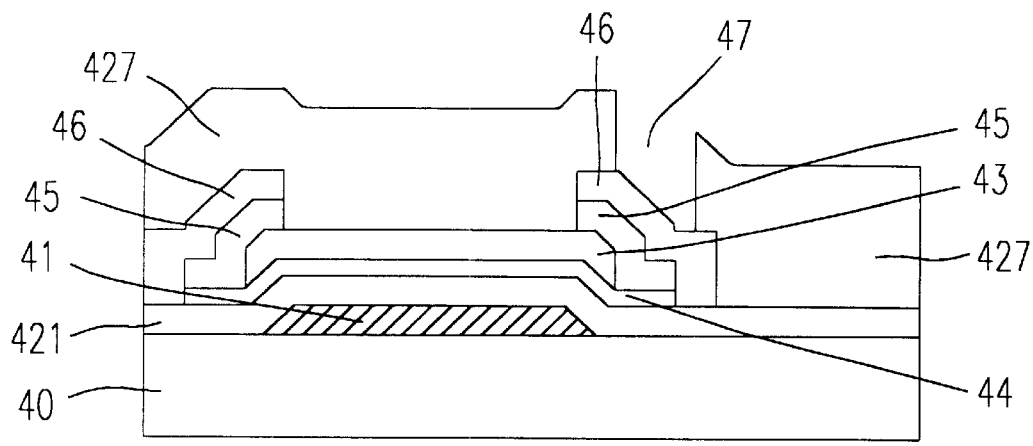
Figure 4K:
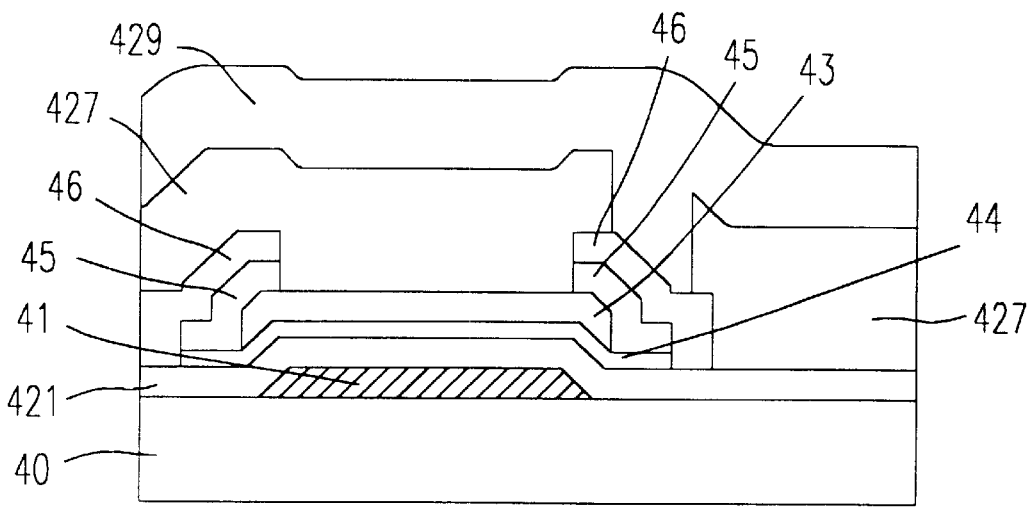
Figure 4L:
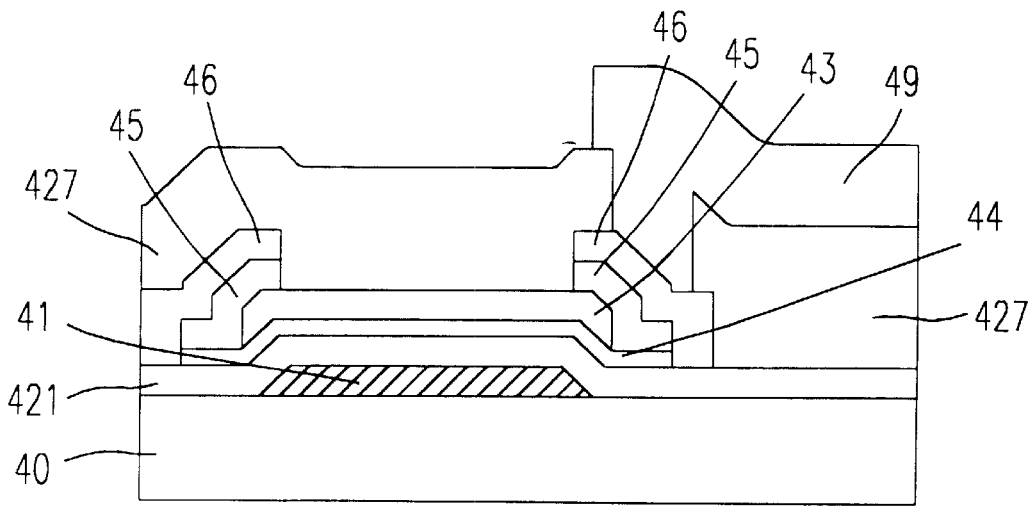

A second preferred embodiment of a process for forming a TFT matrix of a TFTLCD according to the present invention directs to a five-mask process, and it is illustrated with reference to FIGS. 4A~4L. It is to be noted that the division of steps and the provision of serial numbers as below are for corresponding to the drawings, and for easy illustration and understanding, instead of critically indicating the separation or the integration of steps. The preferred embodiment of the process includes steps of:

i) applying a first conductive layer 420 onto a front side 401 of a glass substrate 40, as shown in FIG. 4A;

ii) using a first photo-masking and lithography procedure to pattern and etch the first conductive layer 420 to form an active region 41 consisting of a scan line 411 and a gate electrode 412 of a TFT unit, as shown in FIGS. 4B and 3B wherein FIG. 4B is a cross-sectional view taken along the B—B line of FIG. 3B;

iii) consecutively and sequentially forming an insulation layer 421, a semiconductor layer 422, an etch stopper layer 423, and a photoresist 424 on the resulting structure of FIG. 4B, as shown in FIG. 4C, and exposing the resulting structure from the back side 402 of the substrate 40, as indicated by arrows, wherein a portion of the photoresist 424 above the region 41 is shielded by the region 41 from exposure so as to exhibit a self-aligned effect;

iv) etching off the exposed photoresist 424, a portion of the etch stopper layer 423 thereunder, and the remaining photoresist so that the remaining etch stopper structure 43 has a shape substantially identical to the region 41, as shown in FIG. 4D and with reference to FIG. 3B;

v) applying a highly doped semiconductor layer 425 on the resulting structure of FIG. 4D, as shown in FIG. 4E;

vi) using a second photo-masking and lithography procedure to pattern and etch the semiconductor layer 422 and the highly doped semiconductor layer 425 to define a channel structure 44, as shown in FIG. 4F;

vii) applying a second conductive layer 426 on the resulting structure of FIG. 4F, as shown in FIG. 4G;

viii) using a third photo-masking and lithography procedure to pattern and etch the second conductive layer 426 to define data and connection lines 46, as shown in FIG. 4H;

ix) using the remaining second conductive layer as a shield to etch off a portion of the highly doped semiconductor layer 425 to define source/drain regions 45, as shown in FIG. 4I where the TFT unit 32 is formed;

x) applying a passivation layer 427 on the resulting structure of FIG. 4I, and using a fourth photo-masking and lithography procedure to pattern and etch the passivation layer 427 to create a contact window 47 to expose a portion of the data and connection lines 46, as shown in FIG. 4J, and also to define a tape automated bonding (TAB) openings (not shown);

xi) applying a transparent conductive layer 429 on the resulting structure of FIG. 4J, as shown in FIG. 4K; and xii) using a fifth photo-masking and lithography procedure to pattern and etch the transparent conductive layer 429 to form a pixel electrode 49, as shown in FIG. 4L.

The applying methods and etching methods of all the above layers used in this embodiment can be any suitable conventional techniques which are not to be redundantly described here. On the other hand, the materials of the substrate, the first conductive layer, the insulation layer, the semiconductor layer, the etch stopper layer, the highly doped semiconductor layer, the second conductive layer, the passivation layer, and the transparent conductive layer used in this embodiment can be those respectively exemplified in the first embodiment.

Similar to the first embodiment, the formation of the etch stopper structure 43 is also performed by a backside exposure technique as disclosed in the step iii), which uses the existent active region as shields so that one masking step is omitted, and thus only five masking and patterning procedures are required.

Figure 3C:
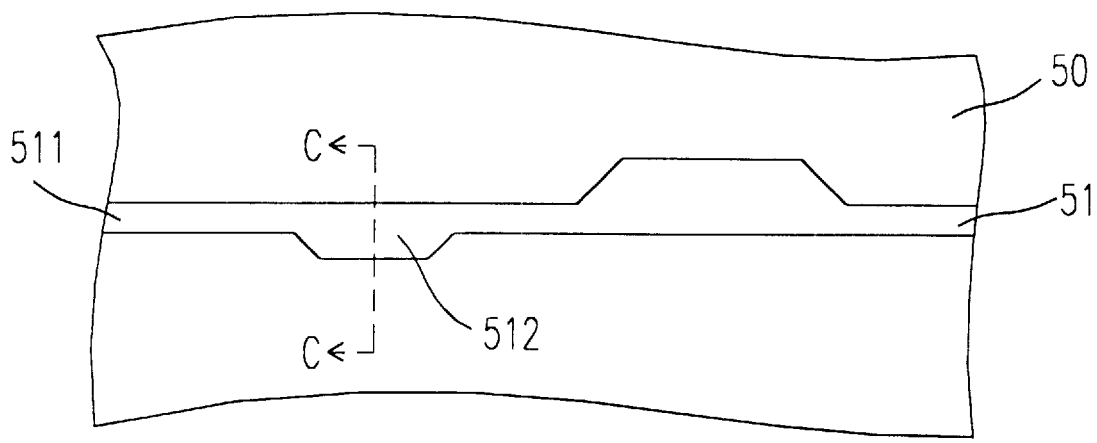
Figure 5A:
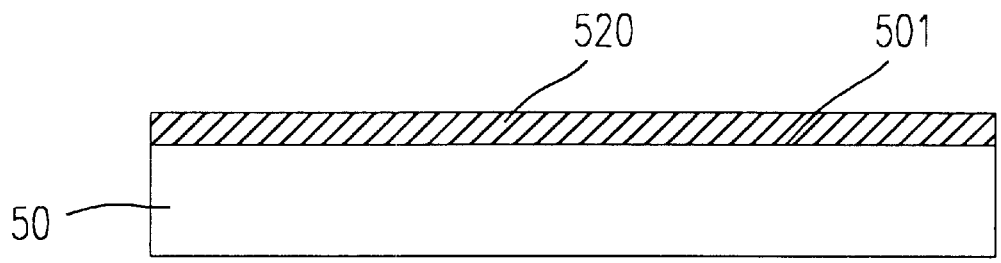
FIGS. 5A–5J are cross-sectional views of intermediate structures of a TFTLCD according to the present invention, which schematically show a third preferred embodiment of a process for forming the TFT matrix.
Figure 5B:
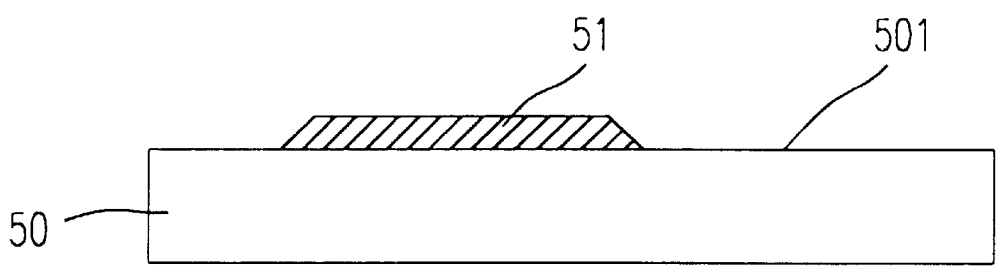
Figure 5C:
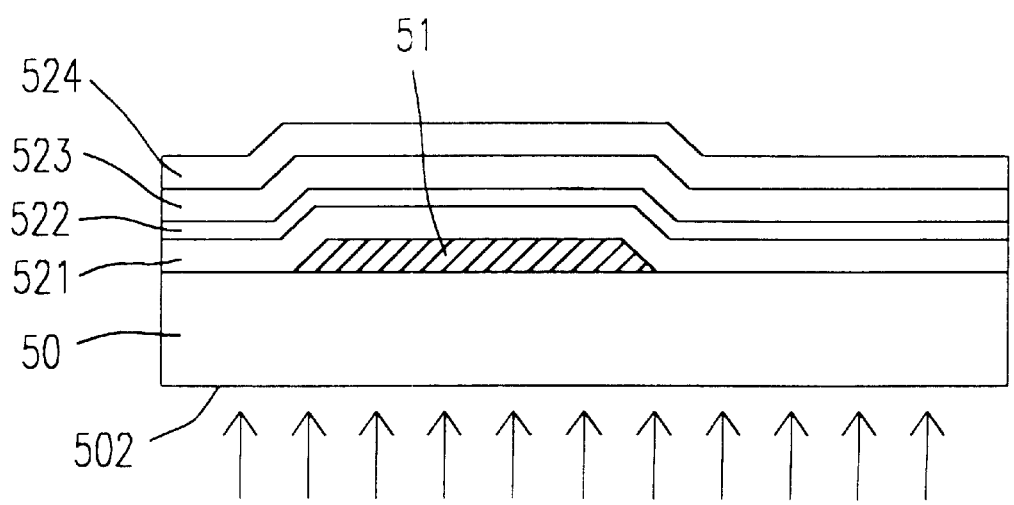
Figure 5D:
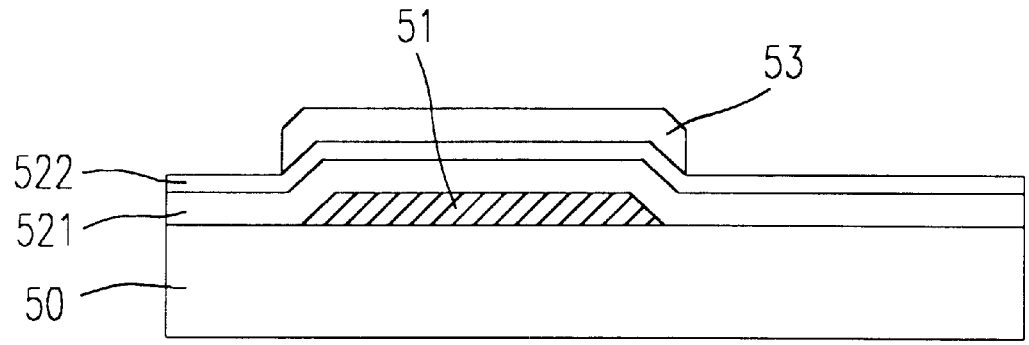
Figure 5E:
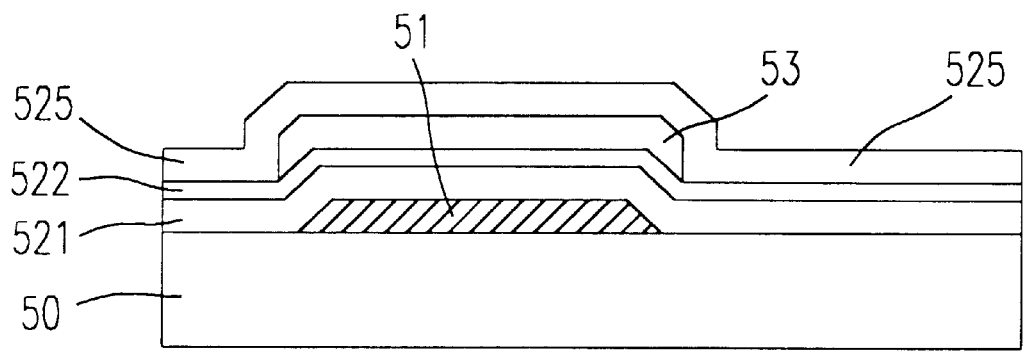
Figure 5F:
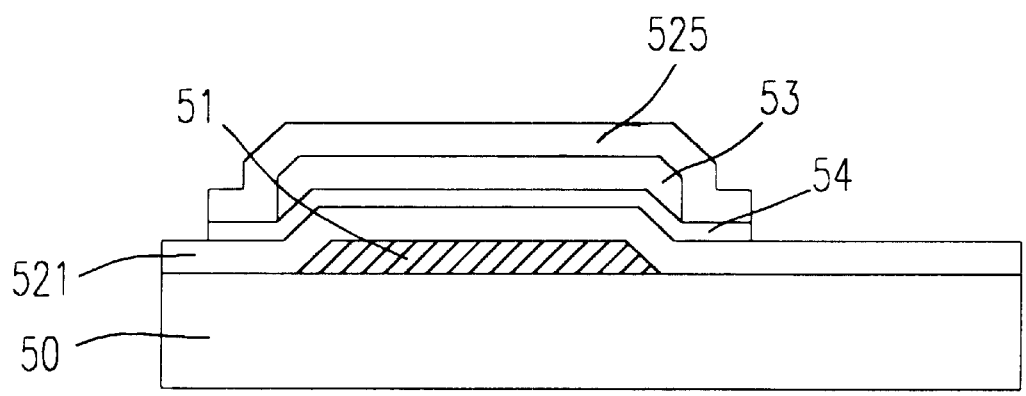
Figure 5G:
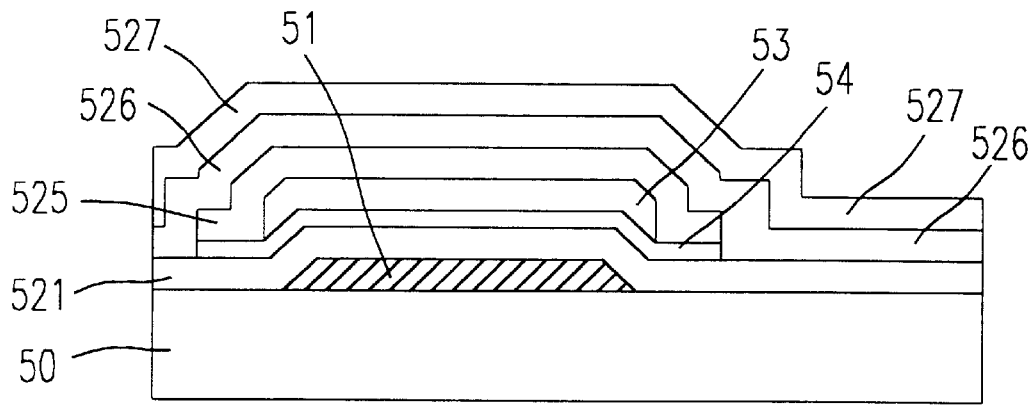
Figure 5H:
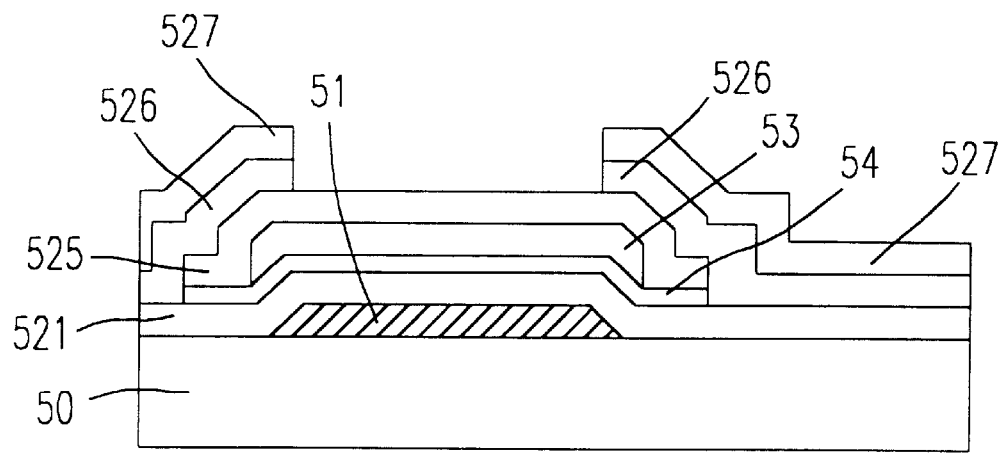
Figure 5I:
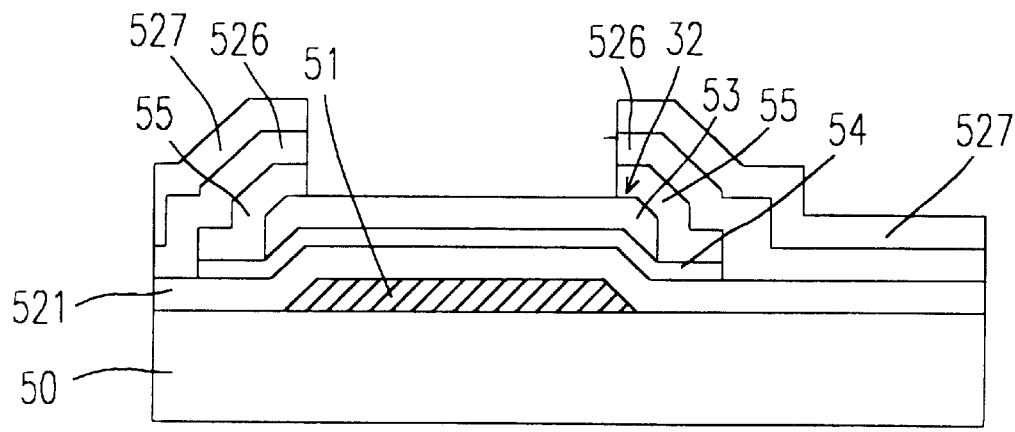
Figure 5J:
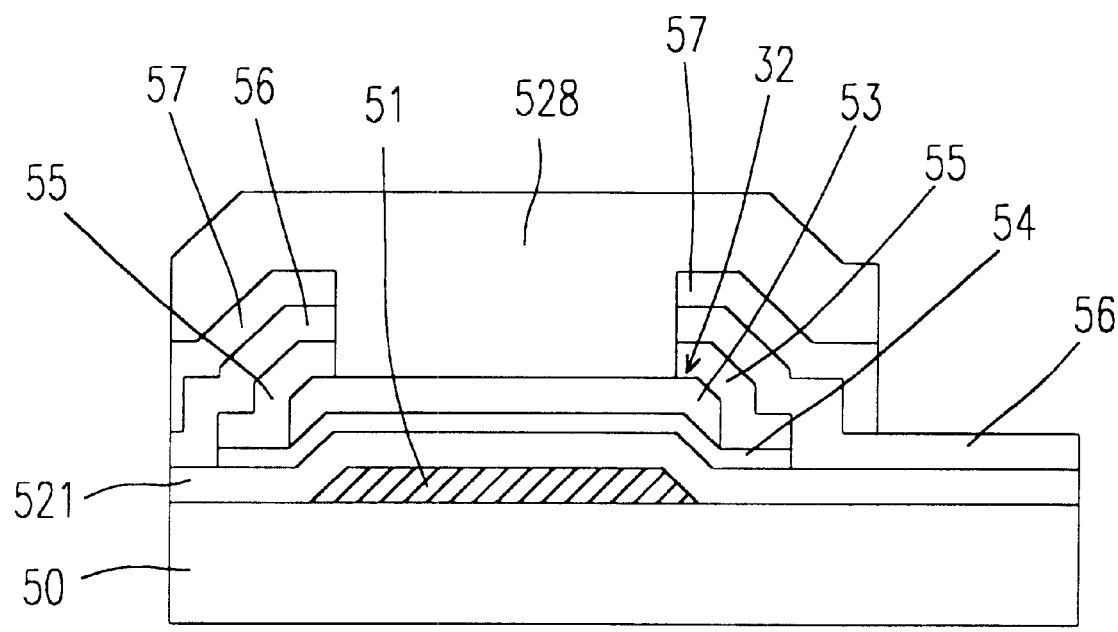

A third preferred embodiment of a process for forming a TFT matrix of a TFTLCD according to the present invention directs to a five-mask process, and it is illustrated with reference to FIGS. 5A~5J. It is to be noted that the division of steps and the provision of serial numbers as below are for corresponding to the drawings, and for easy illustration and understanding, instead of critically indicating the separation or the integration of steps. The preferred embodiment of the process includes steps of:

i) applying a first conductive layer 520 onto a front side 501 of a glass substrate 50, as shown in FIG. 5A;

ii) using a first photo-masking and lithography procedure to pattern and etch the first conductive layer 520 to form an active region 41 consisting of a scan line 511 and a gate electrode 512 of a TFT unit, as shown in FIGS. 5B and 3C wherein FIG. 5B is a cross-sectional view taken along the C—C line of FIG. 3C;

iii) consecutively and sequentially forming an insulation layer 521, a semiconductor layer 522, an etch stopper layer 523, and a photoresist 524 on the resulting structure of FIG. 5B, as shown in FIG. 5C, and exposing the resulting structure from the back side 502 of the substrate 50, as indicated by arrows, wherein a portion of the photoresist 524 above the region 51 is shielded by the region 51 from exposure so as to exhibit a self-aligned effect;

iv) etching off the exposed photoresist 524, a portion of the etch stopper layer 523 thereunder, and the remaining photoresist so that the remaining etch stopper structure 53 has a shape substantially identical to the region 51, as shown in FIG. 5D and with reference to FIG. 3C;

v) applying a highly doped semiconductor layer 525 on the resulting structure of FIG. 5D, as shown in FIG. 5E;

vi) using a second photo-masking and lithography procedure to pattern and etch the semiconductor layer 522 and the highly doped semiconductor layer 525 to define a channel structure 54, as shown in FIG. 5F;

vii) applying a transparent conductive layer 526 and a second conductive layer 527 on the resulting structure of FIG. 5F, as shown in FIG. 5G;

viii) using a third photo-masking and lithography procedure to pattern and etch the second conductive layer 527 and the transparent conductive layer 526 to define data and connection lines 57 and a pixel electrode region 56, respectively, as shown in FIG. 5H;

ix) using the remaining second conductive layer as a shield to etch off a portion of the highly doped semiconductor layer 525 to define source/drain regions 55, as shown in FIG. 5I where the TFT unit 32 is formed; and x) applying a passivation layer 528 on the resulting structure of FIG. 5I, and using a fourth photo-masking and lithography procedure to pattern and etch the passivation layer 528 to expose the pixel electrode region 56, as shown in FIG. 5J. The fourth photo-masking and lithography procedure also defines tape automated bonding (TAB) openings (not shown).

The applying methods and etching methods of all the above layers used in this embodiment can be any suitable conventional techniques which are not to be redundantly described here. On the other hand, the materials of the substrate, the first conductive layer, the insulation layer, the semiconductor layer, the etch stopper layer, the highly doped semiconductor layer, the second conductive layer, the passivation layer, and the transparent conductive layer used in this embodiment can be those respectively exemplified in the first embodiment.

Similar to the first and the second embodiments, the formation of the etch stopper structure 53 is also performed by a backside exposure technique as disclosed in the step iii), which uses the existent active region as shields so that one masking step is omitted. Further, in this embodiment, the transparent conductive layer is formed before the second conductive layer rather than after the passivation layer. Therefore, the masking and patterning procedure for creating a contact window from the passivation layer for the connection of the pixel electrode and the data line can be omitted. In other words, in this embodiment, only four masking and patterning procedures are required.

It is understood that the masking count can be further reduced to three by omitting the passivation layer if reliability is not taken into consideration.

Moreover, there is an additional advantage by having the transparent conductive layer formed before the second conductive layer. After a portion of the second conductive layer is further removed after the fourth masking and patterning procedure, a remaining portion of the second conductive layer surrounds the pixel electrode region can function as black matrix.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a thin film transistor (TFT) matrix for a liquid crystal display (LCD) with four-masking steps, said process comprising steps of:

providing a substrate made of an insulating material;

forming a first conductive layer on a first side of said substrate, and using a first masking and patterning procedure to remove a portion of said first conductive layer to define a scan line and a gate electrode of a TFT unit;

successively forming an insulation layer, a semiconductor layer, an etch stopper layer, and a photoresist layer on said substrate with said scan line and said gate electrode;

providing an exposing source from a second side of said substrate opposite to said first side by using said scan line and said gate electrode as shields to obtain an exposed area and an unexposed area;

removing said photoresist, and said etch stopper layer of said exposed area so that the remaining portion of said etch stopper layer in said unexposed area has a specific shape substantially identical to the shape of said scan line together with said gate electrode;

forming a doped semiconductor layer on said substrate with said etch stopper layer of said specific shape, and using a second masking and patterning procedure to remove a portion of said doped semiconductor layer and a portion of said semiconductor layer to define a channel region;

successively forming a transparent conductive layer and a second conductive layer on said substrate, and using a third masking and patterning procedure to remove a portion of said transparent conductive layer and a portion of said second conductive layer to define a pixel electrode region and data and connection lines, respectively;

removing another portion of said doped semiconductor layer with a remaining portion of said second conductive layer as shields to define source/drain regions;

forming a passivation layer on said substrate, and using a fourth masking and patterning procedure to remove a portion of said passivation layer; and removing another portion of said second conductive layer with said patterned passivation layer as shields to expose said pixel electrode region.

2. The process according to claim 1 wherein said insulating material is a light-transmitting material, and said exposing source is a light radiation.

3. The process according to claim 2 wherein said light-transmitting material is glass.

4. The process according to claim 1 wherein said first conductive layer is formed of a material selected from a group consisting of chromium, tungsten molybdenum, tantalum, aluminum and copper.

5. The process according to claim 1 wherein said insulation layer is formed of a material selected from a group consisting of silicon nitride, silicon oxide, silicon oxynitride, tantalum oxide and aluminum oxide.

6. The process according to claim 1 wherein said semiconductor layer is formed of a material selected from a group consisting of intrinsic amorphous silicon, microcrystalline silicon and polysilicon.

7. The process according to claim 6 wherein an etching gas for said semiconductor layer is selected from a group consisting of carbon tetrafluoride, boron trichloride, chlorine, sulfur hexafluoride, and a mixture thereof.

8. The process according to claim 7 wherein said etch stopper layer is formed of a material selected from a group consisting of silicon nitride, silicon oxide, and silicon oxynitride.

9. The process according to claim 8 wherein an etching gas for said etch stopper layer is selected from a group consisting of carbon tetrafluoride/hydrogen, trifluoromethane, sulfur hexafluoride/hydrogen, and a mixture thereof.

10. The process according to claim 1 wherein said doped semiconductor layer is formed of a material selected from a group consisting of highly doped amorphous silicon, highly doped micro-crystalline silicon and highly doped polysilicon.

11. The process according to claim 1 wherein said second conductive layer is one selected from a group consisting of a chromium/aluminum and a molybdenum/aluminum/molybdenum composite layers.

12. The process according to claim 1 wherein said transparent conductive layer is formed of a material selected from a group consisting of indium tin oxide, indium zinc oxide and indium lead oxide.

13. The process according to claim 1 wherein said passivation layer is formed of a material selected from a group consisting of silicon nitride and silicon oxynitride.

14. The process according to claim 1 wherein after removing said another portion of said second conductive layer after said fourth masking and patterning procedure, a remaining portion of said second conductive layer surrounds said pixel electrode region as black matrix.

15. A process for forming a thin film transistor (TFT) matrix for a liquid crystal display (LCD) with five-masking steps, comprising steps of:
   providing a substrate made of an insulating material;
   forming a first conductive layer on a first side of said substrate, and using a first masking and patterning procedure to remove a portion of said first conductive layer to define a scan line and a gate electrode of a TFT unit;
   successively forming an insulation layer, a semiconductor layer, an etch stopper layer, and a photoresist layer on said substrate with said scan line and said gate electrode;
   providing an exposing source from a second side of said substrate opposite to said first side by using said scan line and said gate electrode as shields to obtain an exposed area and an unexposed area;
   removing said photoresist and said etch stopper layer of said exposed area so that the remaining portion of said etch stopper layer in said unexposed area has a specific shape substantially identical to the shape of said scan line together with said gate electrode;
   using a second masking and patterning procedure to remove a portion of said semiconductor layer to define a channel region;
   successively forming a doped semiconductor layer and a second conductive layer on said substrate, and using a third masking and patterning procedure to remove a portion of said second conductive layer to define data and connection lines;
   removing a portion of said doped semiconductor layer with a remaining portion of said second conductive layer as shields to define source/drain regions;
   forming a passivation layer on said substrate, and using a fourth masking and patterning procedure to remove a portion of said passivation layer to define a contact window; and
   forming a transparent conductive layer on said substrate, and using a fifth masking and patterning procedure to remove a portion of said transparent conductive layer to define a pixel electrode region which is connected to said data and connection lines through said contact window.

16. The process according to claim 15 wherein said insulating material is glass.

17. The process according to claim 15 wherein said first conductive layer is one selected from a group consisting of a chromium, a tungsten molybdenum, a tantalum, a aluminum and a copper layers, and said second conductive layer is one selected from a group consisting of a chromium/aluminum and a molybdenum/aluminum/molybdenum composite layers.

18. The process according to claim 15 wherein said insulation layer is formed of a material selected from a group consisting of silicon nitride, silicon oxide, silicon oxynitride, tantalum oxide and aluminum oxide.

19. The process according to claim 15 wherein said semiconductor layer is formed of a material selected from a group consisting of intrinsic amorphous silicon, micro-crystalline silicon and polysilicon, and an etching gas for said semiconductor layer is selected from a group consisting of carbon tetrafluoride, boron trichloride, chlorine, sulfur hexafluoride, and a mixture thereof.

20. The process according to claim 19 wherein said etch stopper layer is formed of a material selected from a group consisting of silicon nitride, silicon oxide, and silicon oxynitride, and an etching gas for said etch stopper layer is selected from a group consisting of carbon tetrafluoride/hydrogen, trifluoromethane, sulfur hexafluoride/hydrogen, and a mixture thereof.

21. The process according to claim 15 wherein said doped semiconductor layer is formed of a material selected from a group consisting of highly doped amorphous silicon, highly doped micro-crystalline silicon and highly doped polysilicon.

22. The process according to claim 15 wherein said passivation layer is formed of a material selected from a group consisting of silicon nitride and silicon oxynitride.

23. The process according to claim 15 wherein said transparent conductive layer is formed of a material selected from a group consisting of indium tin oxide, indium zinc oxide and indium lead oxide.

24. A process for forming a thin film transistor (TFT) matrix for a liquid crystal display (LCD) with five-masking steps, comprising steps of:
   providing a substrate made of an insulating material;
   forming a first conductive layer on a first side of said substrate, and using a first masking and patterning procedure to remove a portion of said first conductive layer to define a scan line and a gate electrode of a TFT unit;
   successively forming an insulation layer, a semiconductor layer, an etch stopper layer, and a photoresist layer on said substrate with said scan line and said gate electrode;
   providing an exposing source from a second side of said substrate opposite to said first side by using said scan line and said gate electrode as shields to obtain an exposed area and an unexposed area;
   removing said photoresist and said etch stopper layer of said exposed area so that the remaining portion of said etch stopper layer in said unexposed area has a specific shape substantially identical to the shape of said scan line together with said gate electrode;
   forming a doped semiconductor layer on said substrate with said etch stopper layer of said specific shape, and using a second masking and patterning procedure to remove a portion of said doped semiconductor layer and a portion of said semiconductor layer to define a channel region;
   forming a second conductive layer on said substrate, and using a third masking and patterning procedure to remove a portion of said second conductive layer to define data and connection lines;

removing a portion of said doped semiconductor layer with a remaining portion of said second conductive layer as shields to define source/drain regions;

forming a passivation layer on said substrate, and using a fourth masking and patterning procedure to remove a portion of said passivation layer to define a contact window; and forming a transparent conductive layer on said substrate, and using a fifth masking and patterning procedure to remove a portion of said transparent conductive layer to define a pixel electrode region which is connected to said data and connection lines through said contact window.

25. The process according to claim 24 wherein said insulating material is glass.

26. The process according to claim 24 wherein said first conductive layer is one selected from a group consisting of a chromium, a tungsten molybdenum, a tantalum, a aluminum and a copper layers, and said second conductive layer is one selected from a group consisting of a chromium/aluminum and a molybdenum/aluminum/molybdenum composite layers.

27. The process according to claim 24 wherein said insulation layer is formed of a material selected from a group consisting of silicon nitride, silicon oxide, silicon oxynitride, tantalum oxide and aluminum oxide.

28. The process according to claim 24 wherein said semiconductor layer is formed of a material selected from a group consisting of intrinsic amorphous silicon, micro-crystalline silicon and polysilicon, and an etching gas for said semiconductor layer is selected from a group consisting of carbon tetrafluoride, boron trichloride, chlorine, sulfur hexafluoride, and a mixture thereof.

29. The process according to claim 28 wherein said etch stopper layer is formed of a material selected from a group consisting of silicon nitride, silicon oxide, and silicon oxynitride, and an etching gas for said etch stopper layer is selected from a group consisting of carbon tetrafluoride/hydrogen, trifluoromethane, sulfur hexafluoride/hydrogen, and a mixture thereof.

30. The process according to claim 24 wherein said doped semiconductor layer is formed of a material selected from a group consisting of highly doped amorphous silicon, highly doped micro-crystalline silicon and highly doped polysilicon.

31. The process according to claim 24 wherein said passivation layer is formed of a material selected from a group consisting of silicon nitride and silicon oxynitride.

32. The process according to claim 24 wherein said transparent conductive layer is formed of a material selected from a group consisting of indium tin oxide, indium zinc oxide and indium lead oxide.

* * * * *